United States Patent
Jang et al.

(10) Patent No.: US 8,012,781 B2
(45) Date of Patent: Sep. 6, 2011

(54) METHOD FOR FABRICATING AN ELECTROLUMINESCENCE DEVICE

(75) Inventors: Eun Joo Jang, Daejeon-Si (KR); Shin Ae Jun, Seongnam-Si (KR); Sung Hun Lee, Yongin-Si (KR); Tae Kyung Ahn, Seoul (KR); Seong Jae Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/722,903

(22) Filed: Mar. 12, 2010

(65) Prior Publication Data

US 2010/0173434 A1 Jul. 8, 2010

Related U.S. Application Data

(62) Division of application No. 11/002,465, filed on Dec. 3, 2004, now abandoned.

(30) Foreign Application Priority Data

Jun. 9, 2004 (KR) .................................. 2004-42200

(51) Int. Cl.
*H01L 51/56* (2006.01)
(52) U.S. Cl. ....... 438/29; 438/46; 438/99; 257/E51.018; 977/779
(58) Field of Classification Search .................. 438/962; 257/E51.018, E51.019; 977/779, 892, 949
See application file for complete search history.

(56) References Cited

U.S. PATENT DOCUMENTS

| | | | |
|---|---|---|---|
| 5,537,000 | A | 7/1996 | Alivisatos et al. |
| 6,049,090 | A | 4/2000 | Clark, Jr. |
| 6,853,013 | B2 | 2/2005 | Hirai et al. |
| 6,992,317 | B2 | 1/2006 | Jain et al. |
| 6,995,505 | B2 * | 2/2006 | Kim et al. ................. 313/503 |
| 2003/0094626 | A1 | 5/2003 | Duggal et al. |
| 2004/0023010 | A1 | 2/2004 | Bulovic et al. |
| 2004/0124504 | A1 | 7/2004 | Hsu |
| 2005/0069726 | A1 | 3/2005 | Douglas et al. |
| 2005/0110005 | A1 | 5/2005 | Forrest et al. |
| 2005/0201963 | A1 | 9/2005 | Dutta |

FOREIGN PATENT DOCUMENTS

| | | |
|---|---|---|
| JP | 2002525394 A | 8/2002 |
| JP | 2004503640 A | 2/2004 |
| WO | 0017655 A1 | 3/2000 |
| WO | 0196454 A1 | 12/2001 |
| WO | 03084292 A1 | 10/2003 |

* cited by examiner

*Primary Examiner* — Stephen W Smoot
(74) *Attorney, Agent, or Firm* — Cantor Colburn LLP

(57) ABSTRACT

A nanocrystal electroluminescence device comprising a polymer hole transport layer, a nanocrystal light-emitting layer and an organic electron transport layer wherein the nanocrystal light-emitting layer is independently and separately formed between the polymer hole transport layer and the organic electron transport layer. According to the nanocrystal electroluminescence device, since the hole transport layer, the nanocrystal light-emitting layer and the electron transport layer are completely separated from one another, the electroluminescence device provides a pure nanocrystal luminescence spectrum having limited luminescence from other organic layers and substantially no influence by operational conditions, such as voltage. Further, a method for fabricating the nanocrystal electroluminescence device.

11 Claims, 6 Drawing Sheets

METHOD FOR FABRICATING AN ELECTROLUMINESCENCE DEVICE

CROSS-REFERENCE TO RELATED APPLICATIONS

This application is a divisional application of U.S. patent application Ser. No. 11/002,465 filed Dec. 3, 2004, now abandoned, which claims priority to Korean Patent Application No. 2004-42200, filed on Jun. 9, 2004, and all the benefits accruing therefrom under 35 U.S.C. §119 and §120, the content of which in its entirety is herein incorporated by reference.

BACKGROUND OF THE INVENTION

1. Field of the Invention

The present invention relates to an electroluminescence device, and a method for fabricating the electroluminescence device. More particularly, the present invention relates to a nanocrystal electroluminescence device comprising a polymer hole transport layer, a nanocrystal light-emitting layer and an organic electron transport layer wherein the nanocrystal light-emitting layer is independently and separately formed between the polymer hole transport layer and the organic electron transport layer, and a method for fabricating the nanocrystal electroluminescence device.

2. Description of the Related Art

A nanocrystal is defined as a material having a crystal structure at the nanometer-scale level, and consists of a few hundred to a few thousand atoms. Since the small-sized nanocrystal has a large surface area per unit volume, most of the atoms constituting the nanocrystal are present at the surface of the nanocrystal. Based on this structure, the nanocrystal exhibits quantum confinement effects, and shows electrical, magnetic, optical, chemical and mechanical properties different from those inherent to the constituent atoms of the nanocrystal. That is, the control over the physical size of the nanocrystal enables the control of various properties.

Vapor deposition processes, such as metal organic chemical deposition (MOCVD) and molecular beam epitaxy (MBE), have been conventionally used to prepare nanocrystals. On the other hand, a wet chemistry technique wherein a precursor material is added to an organic solvent to grow nanocrystals to a desired size has made remarkable progress in the past decade. According to the wet chemistry technique, as the crystals are grown, the organic solvent is naturally coordinated to the surface of the quantum dot crystals and acts as a dispersant. Accordingly, the organic solvent allows the crystals to grow to the nanometer-scale level. The wet chemistry technique has an advantage in that nanocrystals can be uniformly prepared in size and shape in a relatively simple manner at low cost, compared to conventional vapor deposition processes, e.g., MOCVD and MBE.

However, since nanocrystals prepared by the wet chemistry technique are commonly separated and are then dispersed in an organic solvent, techniques for forming a thin film of the nanocrystals in a solid state are required in order to apply the nanocrystals to electroluminescence devices.

In nanocrystal electroluminescence devices reported hitherto, the nanocrystals are used as luminescent materials, or have functions of light emission, in combination with charge transport. The first electroluminescence device employing nanocrystals was suggested in U.S. Pat. No. 5,537,000. The electroluminescence device is formed using one or more layers of nanocrystals as an electron transport layer, and preferably capable of emitting light. Accordingly, the luminescence wavelengths of the electroluminescence device are varied in response to the changes in the voltages applied to the device.

PCT publication WO/03/084292 teaches a device wherein a layer of an organic-inorganic hybrid matrix containing nanocrystals is disposed between two electrodes. Specifically, the device is fabricated by mixing nanocrystals and a low molecular weight hole transporting material, such as N,N-diphenyl-N,N-bis(3-methylphenyl)-(1,1-biphenyl)-4,4-diamine (TPD), with a solvent, and spin coating the mixture on an electrode. When the coating conditions and the mixing ratio between the nanocrystals and the hole transporting material are appropriately controlled, a nanocrystal layer is formed on top of a hole transport layer due to the difference in the intermolecular force or density between the nanocrystals and the hole transporting material. However, although the nanocrystal layer is formed on top of the hole transport layer, the hole transporting material is mixed with the nanocrystals in the transport layer. Accordingly, the overlying electron transport layer is in contact with the hole transport layer, and thus the hole and electron transport layers as well as the nanocrystal layer emit light. To solve this problem, the PCT publication discloses a technique for arranging a hole blocking layer on a thin film of the hole transport layer containing the nanocrystals, followed by forming the electron transport layer on the hole blocking layer. Meanwhile, the hole transporting material mixed with the nanocrystals has a low molecular weight. If a polymer is used as the hole transporting material, its solubility is low and thus the polymer is limited to material which can be dissolved in solvents which dissolve the nanocrystal. Although the polymer which can be dissolved are used, the solubility of the polymer is not sufficiently high, rendering it difficult to control the thickness of the nanocrystal layer and the hole transport layer.

U.S. Pat. No. 6,049,090 describes a device wherein a mixed layer of nanocrystals and a matrix as a light-emitting layer is disposed between two electrodes. According to the device, the matrix is selected to have a wider bandgap energy, a higher conduction band energy level and a lower valence band energy level than the nanocrystals so as to allow the nanocrystals to emit light well and trap electrons and holes in nanocrystals, thereby enhancing the luminescence efficiency of the device.

As stated above, the conventional electroluminescence devices employing nanocrystals as luminescent materials are devices wherein the nanocrystals have functions of light emission in combination with charge transport, are mixed with a hole transporting material to form a mixed layer, or are mixed with a hole transporting material and coated to form a nanocrystal layer separately formed on a hole transport layer due to the density difference depending on the processing conditions. However, since none of these conventional electroluminescence devices provide a pure nanocrystal luminescence spectrum, they have a problem of low color purity.

OBJECTS AND SUMMARY

Therefore, the present invention has been made in view of the above problems of the related art, and it is an object of the present invention to provide an electroluminescence device comprising a polymer hole transport layer, a nanocrystal light-emitting layer and an organic electron transport layer wherein the nanocrystal light-emitting layer is independently and separately formed between the polymer hole transport layer and the organic electron transport layer, thereby providing a pure nanocrystal luminescence spectrum and increasing the color purity of the electroluminescence device.

It is another object of the present invention to provide a method for fabricating the electroluminescence device wherein materials for a hole transport layer can be selected, regardless of the solubility in a solvent which disperses nanocrystals.

In accordance with one aspect of the present invention, the above objects can be accomplished by an electroluminescence device comprising a polymer hole transport layer, a nanocrystal light-emitting layer and an organic electron transport layer wherein the nanocrystal light-emitting layer in contact with the polymer hole transport layer is separately formed between the polymer hole transport layer and the organic electron transport layer.

In accordance with another aspect of the present invention, there is provided a method for fabricating the electroluminescence device, comprising the steps of: patterning a hole-injecting anode on a substrate and forming a polymer hole transport layer thereon; coating a nanocrystal dispersion on the polymer hole transport layer to form a nanocrystal light-emitting layer; forming an organic electron transport layer on the nanocrystal light-emitting layer; and forming an electron-injecting cathode on the organic electron transport layer.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The present invention will now be described in more detail with reference to the accompanying drawings.

An electroluminescence device according to the present invention comprises a polymer hole transport layer, a nanocrystal light-emitting layer and an organic electron transport layer wherein the nanocrystal light-emitting layer in contact with the polymer hole transport layer is separately and independently formed between the polymer hole transport layer and the organic electron transport layer.

Figure 1:
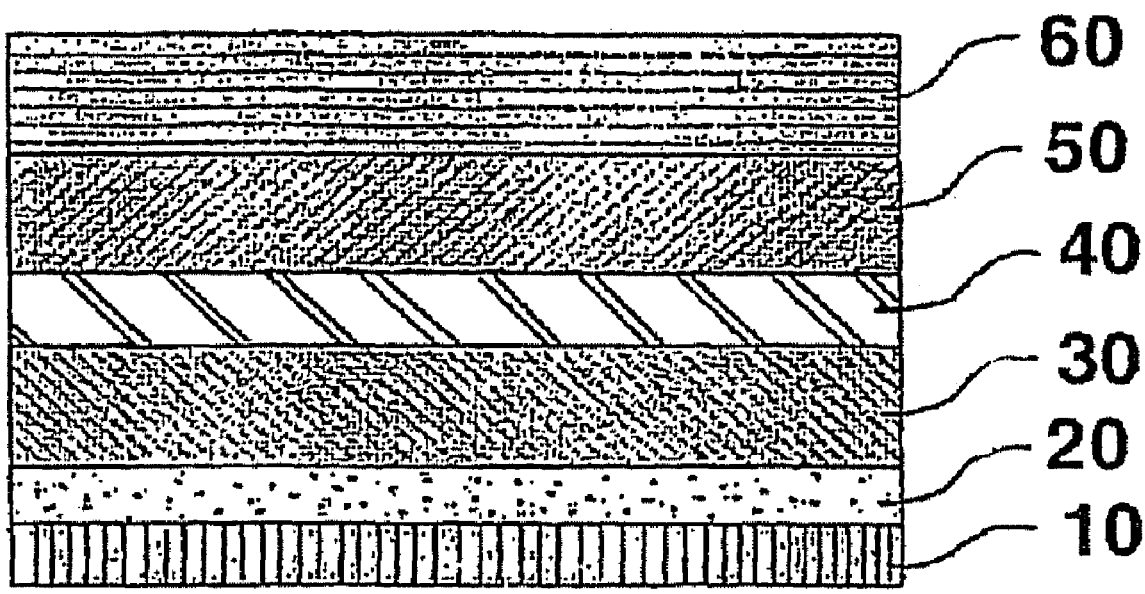
FIG. 1 is a cross-sectional view schematically showing a nanocrystal electroluminescence device according to one embodiment of the present invention.

FIG. 1 is a cross-sectional view schematically showing the nanocrystal electroluminescence device according to one embodiment of the present invention. Referring to FIG. 1, the electroluminescence device of the present invention comprises an anode 20, a polymer hole transport layer 30, a nanocrystal light-emitting layer 40, an organic electron transport layer 50, and a cathode 60 layered in this order on a transparent substrate 10. The polymer hole transport layer 30 is formed of a material capable of transporting holes, and the electron transport layer 50 is made of a material capable of transporting electrons. When a voltage is applied between the two electrodes, the anode 20 injects holes into the hole transport layer 30, and the cathode 60 injects electrons into the electron transport layer 50. The injected holes are combined with the injected electrons at the same molecules to form exciton pairs, and then the exciton pairs are recombined to emit light.

Optionally, the electroluminescence device of the present invention further comprises a hole injection layer interposed between the anode 20 and the hole transport layer 30; an electron blocking layer, a hole blocking layer or an electron/hole blocking layer interposed between the hole transport layer 30 and the nanocrystal light-emitting layer 40; or an electron blocking layer, a hole blocking layer or an electron/hole blocking layer interposed between the nanocrystal light-emitting layer 40 and the electron transport layer 50.

The transparent substrate 10 used in the electroluminescence device of the present invention may be a substrate used in common organic electroluminescence devices. A glass or transparent plastic substrate is preferred in terms of superior transparency, superior surface smoothness, ease of handling, and excellent waterproofness. Specific examples of the transparent substrate include polyethyleneterephthalate, polycarbonate substrates, and the like. The thickness of the transparent substrate 10 is preferably in the range of 0.3~1.1 mm.

The anode 20 formed on the transparent substrate 10 may be made of an electrically conductive metal or its oxide so that it can easily injects holes. As specific examples, indium tin oxide (ITO), indium zinc oxide (IZO), nickel (Ni), platinum (Pt), gold (Au), silver (Ag), and iridium (Ir) may be mentioned.

Examples of materials for the hole transport layer 30 include, but are not limited to, poly(3,4-ethylenedioxythiophene) (PEDOT)/polystyrene para-sulfonate (PSS), poly-N-vinylcarbazole derivatives, polyphenylenevinylene derivatives, polyparaphenylene derivatives, polymethacrylate derivatives, poly(9,9-octylfluorene) derivatives, poly (spiro-fluorene) derivatives, and the like. The thickness of the hole transport layer 30 is preferably in the range of 10 nm to 100 nm.

Materials commonly used in the art can be used to form the organic electron transport layer 50. Specific examples of materials for the organic electron transport layer 50 include, but are not limited to, oxazoles, isooxazoles, triazoles, isothiazoles, oxydiazoles, thiadiazoles, perylenes, and aluminum complexes, including tris(8-hydroxyquinoline)-aluminum (Alq3), Balq, Salq and Almq3. The thickness of the organic electron transport layer 50 is preferably between 10 nm and 100 nm.

Suitable materials for the electron blocking layer, the hole blocking layer or the electron/hole blocking layer are those commonly used in the art. Specific examples include, but are not limited to, 3-phenyl-4-(1-naphthyl)-5-phenyl-1,2,4-triazole (TAZ), 2,9-dimethyl-4,7-diphenyl-1,10-phenanthroline (BCP), phenanthrolines, imidazoles, triazoles, oxadiazoles, and aluminum complexes. The thickness of the electron blocking layer, hole blocking layer and electron/hole blocking layer is preferably in the range of 5 nm to 50 nm.

Examples of materials for the electron-injecting cathode 60 include, but are not limited to, metals having a sufficiently low work function to easily inject electrons, such as [I], Ca, Ba, Ca/Al, LiF/Ca, LiF/Al, $BaF_2$/Al, $BaF_2$/Ca/Al, Al, Mg, and Ag:Mg alloys. The thickness of the cathode is preferably in the range of 50 nm to 300 nm.

Nanocrystals that can be used in the present invention include most of the nanocrystals prepared by a wet chemistry technique, such as metal nanocrystals and semiconductor nanocrystals. Specifically, the nanocrystal light-emitting layer 40 is made of at least one material selected from the group consisting of metal nanocrystals, such as Au, Ag, Pt, Pd, Co, Cu and Mo, Group II-VI compound semiconductor nanocrystals, such as CdS, CdSe, CdTe, ZnS, ZnSe, ZnTe, HgS, HgSe and HgTe, and Group III-V compound semiconductor nanocrystals, such as GaN, GaP, GaAs, InP and InAs, and PnS, PbSe, PbTe. If the nanocrystal light-emitting layer is made of a mixture of two or more nanocrystals, the nanocrystals may exist in the state of a simple mixture, fused crystals in which the nanocrystals are partially present in the same crystal structure, or an alloy. The thickness of the nanocrystal light-emitting layer is between 3 nm and 30 nm.

The present invention is directed to a method for fabricating the nanocrystal electroluminescence device. According to the method of the present invention, a polymer hole transporting material is coated on a hole-injecting anode by various coating processes, and baked to form a rigid thin film of a polymer hole transport layer. A nanocrystal dispersion is coated on the polymer hole transport layer by various coating processes to form a thin film of a nanocrystal light-emitting layer. At this time, the nanocrystal dispersion is prepared by dispersing nanocrystals in a solvent which does not dissolve the polymer hole transport layer. The nanocrystal light-emitting layer thus formed is separated from the polymer hole transport layer. Thereafter, an organic electron transport layer and an electron-injecting cathode are sequentially formed on the nanocrystal light-emitting layer.

Figure 2:
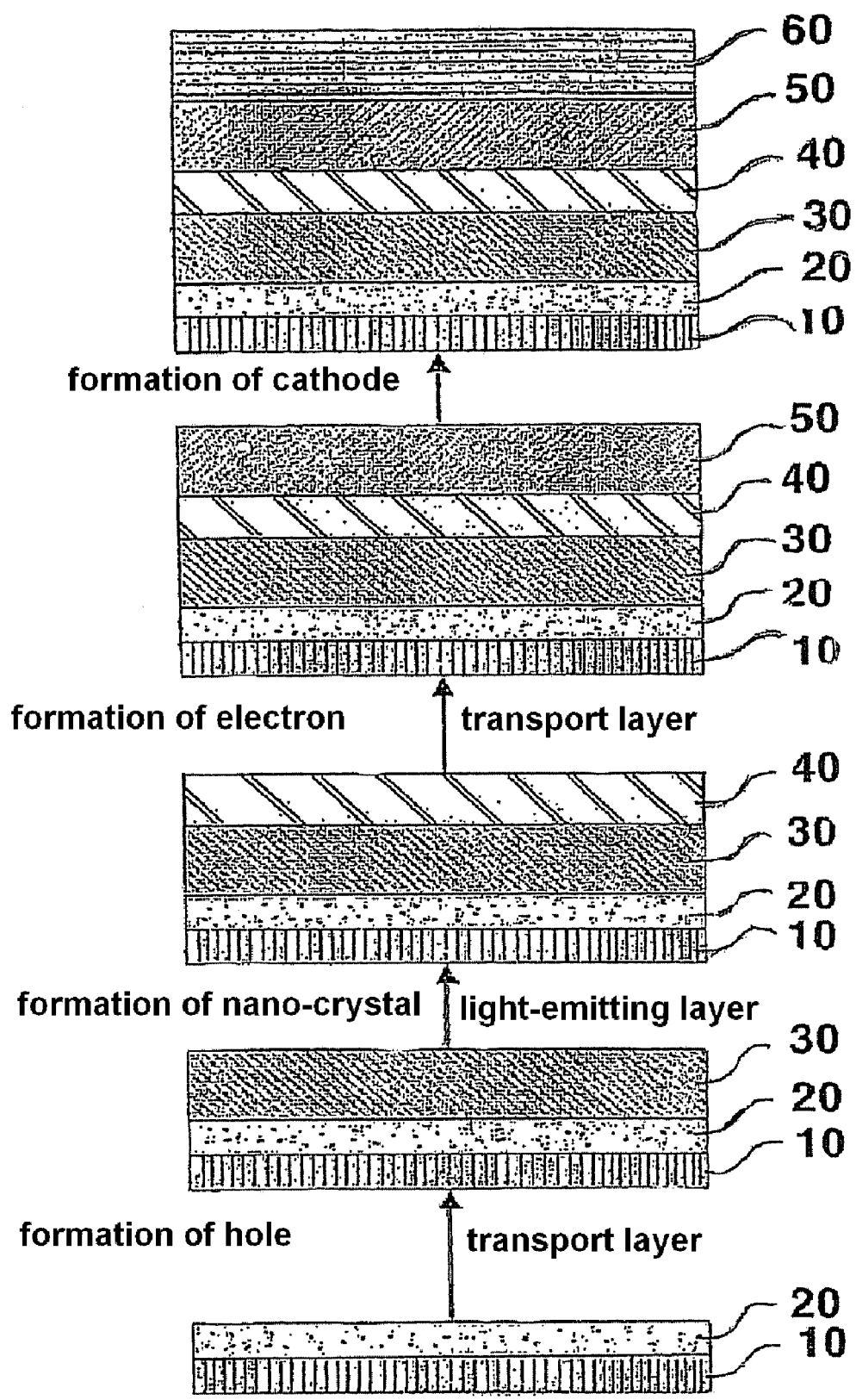
FIG. 2 shows cross-sectional views illustrating the steps of a method for fabricating a nanocrystal electroluminescence device according to one embodiment of the present invention.

FIG. 2 shows cross-sectional views illustrating the steps of the method for fabricating the electroluminescence device shown in FIG. 1, in accordance with the present invention. Referring to FIG. 2, a hole-injecting anode 20 is patterned on a substrate 10, and then a polymer hole transporting material is coated on the substrate 10 by various coating processes, such as spin coating, to form a polymer hole transport layer 30. The polymer hole transport layer 30 is then baked into a rigid thin film so that the polymer hole transport layer is not damaged in the subsequent formation step of a nanocrystal light-emitting layer. Next, a nanocrystal dispersion is coated on the polymer hole transport layer 30 by various coating processes, such as spin coating, to form a nanocrystal light-emitting layer 4. At this time, the nanocrystal dispersion is prepared by dispersing nanocrystals in a solvent which does not substantially dissolve the polymer hole transport layer 30. Thereafter, an organic electron transport layer 50 is formed on the nanocrystal light-emitting layer 40, and then a cathode is formed thereon to form the final electroluminescence device.

The substrate 10 on which the anode 20 is patterned is commonly washed with solvents, such as a neutral detergent, deionized water, acetone and isopropyl alcohol, and is then subjected to UV-ozone and plasma treatment.

According to the method of the present invention, the nanocrystal light-emitting layer is formed in accordance with the following procedure. Nanocrystals surface-bound by a photosensitive compound are dispersed in a solvent which does not damage the polymer hole transport layer to obtain a nanocrystal dispersion. The nanocrystal dispersion is coated on the polymer hole transport layer to form a thin film of the nanocrystals. Alternatively, nanocrystals surface-bound by a material containing no photosensitive functional group and a photosensitive compound are dispersed in a solvent which does not damage the polymer hole transport layer to obtain a nanocrystal dispersion. The nanocrystal dispersion is coated on the polymer hole transport layer to form a thin film of the nanocrystals.

The solvent which does not damage the hole transport layer and can disperse the nanocrystals is selected from the group consisting of water, pyridine, ethanol, propanol, butanol, pentanol, hexanol, toluene, chloroform, chlorobenzene, THF, cyclohexane, cyclohexene, methylene chloride, pentane, hexane, heptane, octane, nonane, decane, undecane, dodecane, and mixtures thereof.

Prior to coating the organic electron transporting material on the nanocrystal light-emitting layer 40, the nanocrystal light-emitting layer 40 can be exposed to UV light at a wavelength of 200 nm to 450 nm to crosslink it. The luminescence wavelength of the nanocrystal light-emitting layer 40 is in the range of 350 nm to 1,300 nm.

The solvent which does not damage the nanocrystal light-emitting layer, the polymer hole transporting material, and the hole transport layer, and can disperse the nanocrystals is as described above. The concentration of the nanocrystal dispersion is preferably between 0.01 wt % and 10 wt %, more preferably between 0.1 wt % and 5 wt %, and most preferably between 0.2 wt % and 2 wt %.

As the material for the organic electron transport layer 50, a low- or high-molecular weight material can be used. Vacuum deposition and wet coating can be employed as the coating processes. The first process for forming the organic electron transport layer 50 by wet coating is performed by the following procedure. Nanocrystals surface-bound by a photosensitive compound are formed into a thin film of the nanocrystals, and exposed to UV light to crosslink the thin film, thereby making the thin film insoluble in a solvent containing an electron transporting material. Thereafter, the organic electron transporting material is wet-coated on the nanocrystal layer to form the organic electron transport layer 50. The second process for forming the organic electron transport layer 50 by wet coating is performed by the following procedure. Nanocrystals surface-bound by a material containing no photosensitive functional group, and a photosensitive compound are thoroughly mixed, formed into a thin film of the nanocrystals, and exposed to UV light to crosslink the photosensitive material, thereby forming a network structure. The network structure traps the nanocrystals, which makes the thin film insoluble in a solvent containing an electron transporting material. Thereafter, the organic electron transporting material is wet-coated on the nanocrystal layer to form the organic electron transport layer 50.

The organic material surface-bound to the nanocrystals contains at least one functional group selected from the group consisting of acetyl, acetic acid, phosphine, phosphonic acid, alcohol, vinyl, carboxyl, amide, phenyl, amine, acryl, silane, cyano and thiol groups at one or both terminals of its alkyl chain or aromatic moiety.

The photosensitive compound surface-bound to the nanocrystals contains a double bond, a carboxyl group, an amide group, a phenyl group, a biphenyl group, a peroxide group, an amine group, an acryl group, or the like.

The method for fabricating the electroluminescence device according to the present invention may further comprise the step of inserting a hole injection layer between the anode and the hole transport layer; inserting an electron blocking layer between the light-emitting layer and the hole transport layer; or inserting a hole blocking layer between the nanocrystal light-emitting layer and the electron transport layer.

Figure 3A:
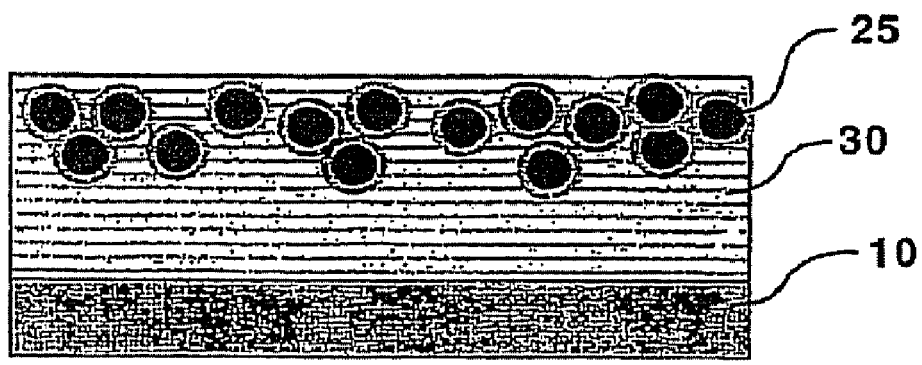
FIG. 3a is a partial cross-sectional view schematically showing a conventional electroluminescence device in which after a mixture of nanocrystals and a hole transporting material is coated, the resulting hole transport layer and nanocrystal layer are incompletely separated from each other.
Figure 3B:
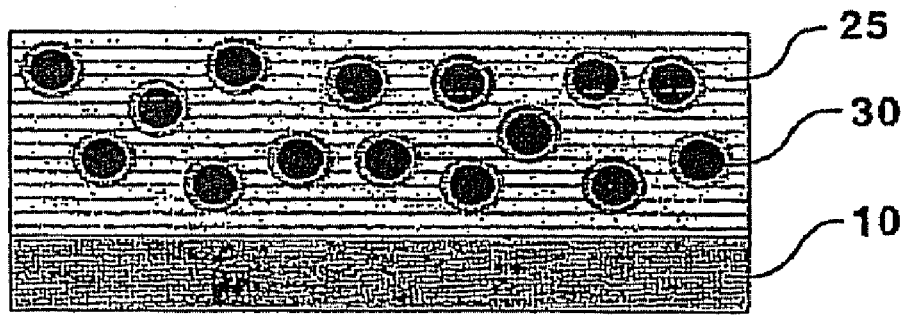
FIG. 3b is a partial cross-sectional view showing another conventional electroluminescence device in which after a mixture of nanocrystals and a hole transporting material is coated, the nanocrystals are uniformly dispersed in the hole transporting material to form one mixed layer.
Figure 3C:
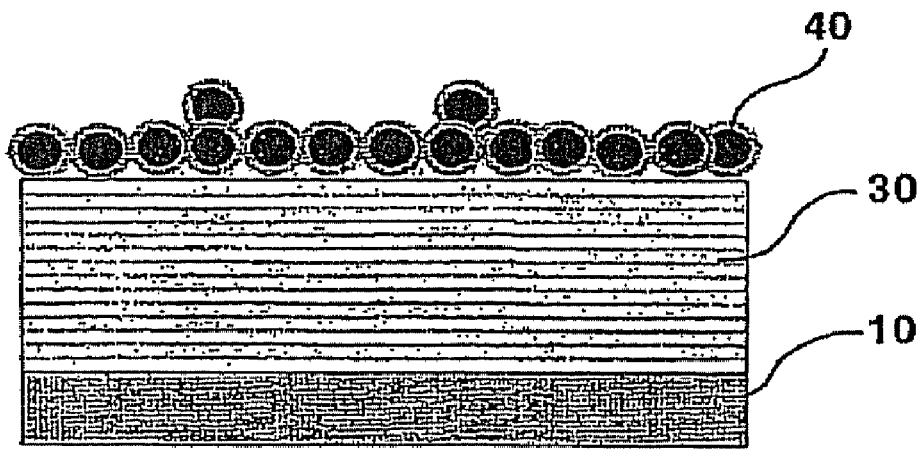
FIG. 3c is a partial cross-sectional view schematically showing a nanocrystal electroluminescence device of the present invention in which after a hole transporting material is coated to form a thin film, baked, and coated with nanocrystals, a nanocrystal light-emitting layer is completely separated from a hole transport layer.

FIGS. 3a and 3b show states wherein a mixture of nanocrystals and a organic hole transporting material is coated by spin coating to form thin films. The organic hole transporting material used herein may be a low- or high-molecular weight material. FIG. 3a shows a state wherein after a mixture of nanocrystals and a organic hole transporting material is spin-coated, a nanocrystal layer is formed on top of a hole transport layer due to the difference in the intermolecular force or density between the nanocrystals and the hole transporting material. However, although the nanocrystals 25 can form a layer partially separated from the hole transporting material, most of the hole transporting material is mixed with the nanocrystals in the nanocrystal layer. FIG. 3b shows a state wherein nanocrystals 25 are uniformly dispersed in a hole transporting material to form one mixed layer. FIG. 3c shows a state wherein a nanocrystal light-emitting layer 40 is completely separated from a hole transport layer 30 by the method of the present invention shown in FIG. 2.

The fabrication of the electroluminescence device of the present invention does not require particular fabrication apparatuses and methods, in addition to the formation of the independent and separate nanocrystal light-emitting layer. The electroluminescence device of the present invention can be fabricated in accordance with conventional fabrication methods using common luminescent materials.

To form the hole transport layer 30 and the electron transport layer 50 into thin films, spin coating, dip coating, spray coating, blade coating, and other coating processes can be used. The exposure of the thin films used in the method of the present invention may be carried out by a contact exposure or non-contact exposure process. The electron transport layer 50 can be formed on the nanocrystal light-emitting layer 40 by thermal deposition, molecular deposition or chemical deposition.

After formation of the thin films, drying can be carried out at 20° C.~300° C. and preferably 40° C.~120° C. In addition, the energy for photosensitization treatment is dependent on the thickness of the thin films, and is preferably between 50 mJ/cm$^2$ and 850 mJ/cm$^2$. When the exposure energy is out of this range, sufficient crosslinking is not likely to take place, or there is a risk of damage to the thin film. Light sources usable for the light exposure preferably have an energy in the range of about 100 W to about 800 W at an effective wavelength of 200~500 nm and preferably 300~400 nm.

Hereinafter, the present invention will be explained in more detail with reference to the following examples. However, these examples are made only for illustrative purposes of preferred embodiments and are not to be construed as limiting the scope of the invention.

Preparative Example 1

Figure 4:
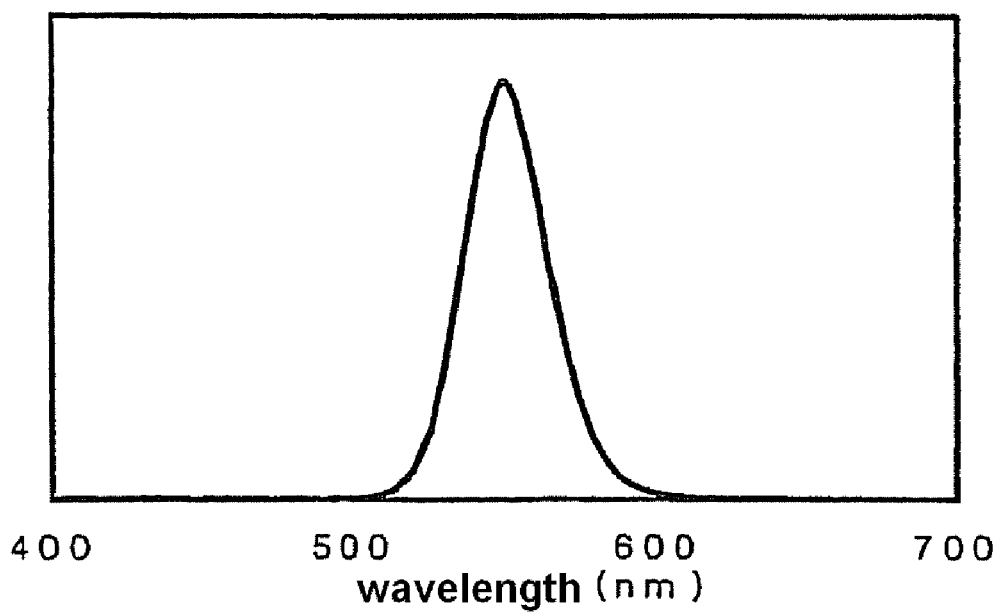
FIG. 4 is a photoluminescence spectrum of silica nanocrystals surface-bound by a photosensitive compound, which is prepared in Preparative Example 1 of the present invention.

Preparation of CdSeS Nanocrystals 16 g of trioctyl amine (hereinafter, referred to as 'TOA'), 0.5 g of oleic acid, and 0.4 mmol of cadmium oxide were charged into a 125 ml flask equipped with a reflux condenser. The reaction temperature of the mixture was adjusted to 300° C. with stirring. Separately, a selenium (Se) powder was dissolved in trioctyl phosphine (hereinafter, referred to as TOP) to obtain an Se-TOP complex solution (Se concentration: about 0.25M), and a sulfur (S) powder was dissolved in TOP to obtain an S-TOP complex solution (S concentration: about 1.0M). 0.9 ml of the S-TOP complex solution and 0.1 ml of the Se-TOP complex solution were rapidly fed to the previous mixture, and then reacted for 4 minutes with stirring. After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant, 1 wt % of the precipitates were dispersed in toluene to prepare a dispersion of CdSeS nanocrystals. The nanocrystals emitted light green light under a UV lamp at 365 nm. FIG. 4 shows a photoluminescence spectrum of the dispersion of CdSeS nanocrystals. As shown in FIG. 4, a photoluminescence peak having a full-width at half maximum (FWHM) of about 30 nm was observed around 552 nm.

Preparative Example 2

Preparation of CdSe/ZnS Nanocrystals 16 g of TOA, 0.5 g of oleic acid, and 0.1 mmol of cadmium oxide were simultaneously charged into a 125 ml flask equipped with a reflux condenser. The reaction temperature of the mixture was adjusted to 300° C. with stirring. Separately, a Se powder was dissolved in TOP to obtain an Se-TOP complex solution (Se concentration: about 2M). 1 ml of the S-TOP complex solution was rapidly fed to the previous mixture, and then reacted for about 10 seconds with stirring. After the reaction was completed, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant, the precipitates were dispersed in toluene to prepare a dispersion of CdSe nanocrystals.

Figure 5:
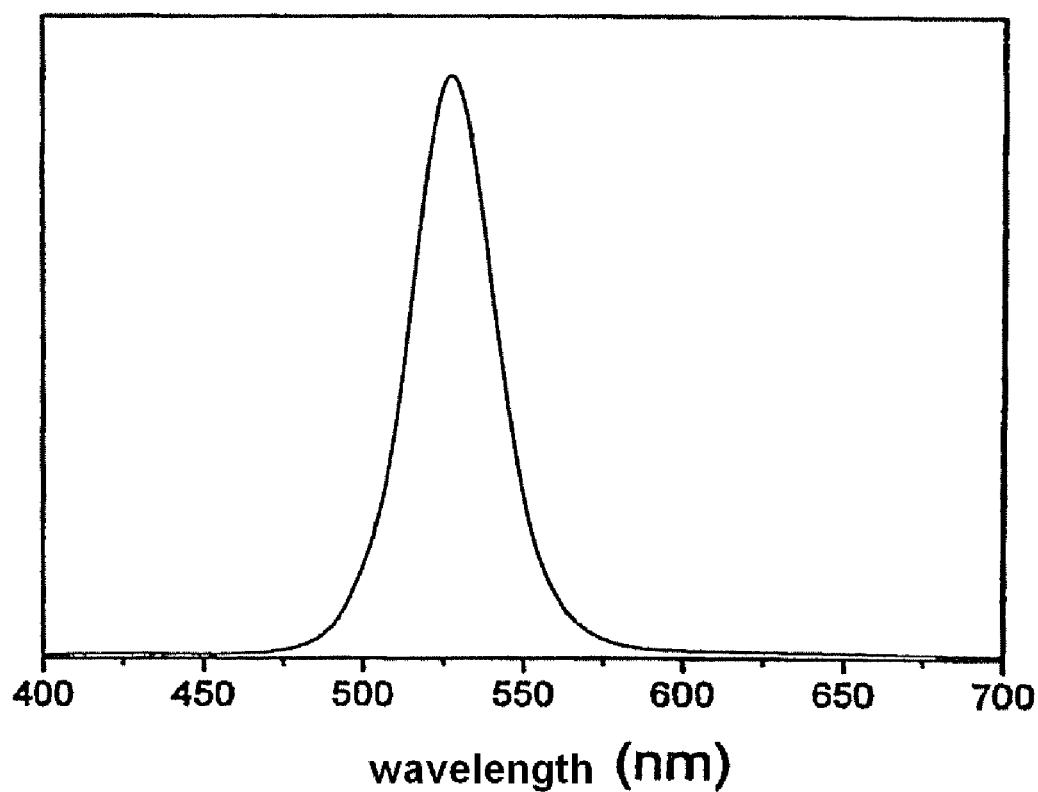
FIG. 5 is a photoluminescence spectrum of silica nanocrystals surface-bound by a photosensitive compound, which is prepared in Preparative Example 2 of the present invention.

On the other hand, 8 g of TOA and 0.4 mmol of zinc acetate were simultaneously charged into a 125 ml flask equipped with a reflux condenser. The reaction temperature of the mixture was adjusted to 260° C. with stirring. After the dispersion of CdSe nanocrystals was added to the reaction mixture, the reaction was allowed to proceed for about 1 hour while an S-TOP complex solution was slowly added thereto. After completion of the reaction, the reaction mixture was cooled to room temperature as rapidly as possible. Ethanol as a non-solvent was added to the reaction mixture, and the resulting mixture was then centrifuged. After the obtained precipitates were separated from the mixture by decanting the supernatant, the precipitates were dispersed in toluene to prepare a dispersion of CdSe/ZnS nanocrystals. The nanocrystals emitted light green light under a UV lamp at 365 nm. FIG. 5 shows a photoluminescence spectrum of the dispersion of CdSe/ZnS nanocrystals. As shown in FIG. 5, a photoluminescence peak having a full-width at half maximum (FWHM) of about 30 nm was observed around 527 nm.

Example 1

Fabrication of Electroluminescence Device Employing CdSeS Nanocrystal Light-Emitting Layer Dispersed in Octane This example shows the fabrication of an electroluminescence device wherein a nanocrystal light-emitting layer is independently and separately formed. First, an ITO-patterned glass substrate was sequentially washed with a neutral detergent, deionized water, water and isopropyl alcohol, and was then subjected to UV-ozone treatment. A solution of 1 wt % of poly(9,9'-dioctylfluorene-co-N-(4-butylphenyl)diphenylamine (TFB) in chlorobenzene was spin-coated on the ITO-patterned substrate to a thickness of about 50 nm, and then baked at 180° C. for 10 minutes to form a hole transport layer. A dispersion of the CdSeS nanocrystals (1 wt %) prepared in Preparative Example 1 in octane was spin-coated on the hole transport layer, and dried to form a nanocrystal light-emitting layer having a thickness of about 5 nm. At this time, the octane used herein is a solvent which does not dissolve the hole transport layer.

(3-4-Biphenyl)-4-phenyl-5-(4-tert-butylphenyl)-1,2,4-triazole (TAZ) was deposited on the completely dried nanocrystal light-emitting layer to form a hole blocking layer having a thickness of 10 nm, and then tris(8-hydroxyquinoline)-aluminum (Alq3) was deposited thereon to form an electron transport layer having a thickness of about 30 nm. LiF and aluminum were sequentially deposited on the electron transport layer to thicknesses of 1 nm and 200 nm, respectively, to form a cathode, thereby fabricating the final electroluminescence device.

Figure 6A:
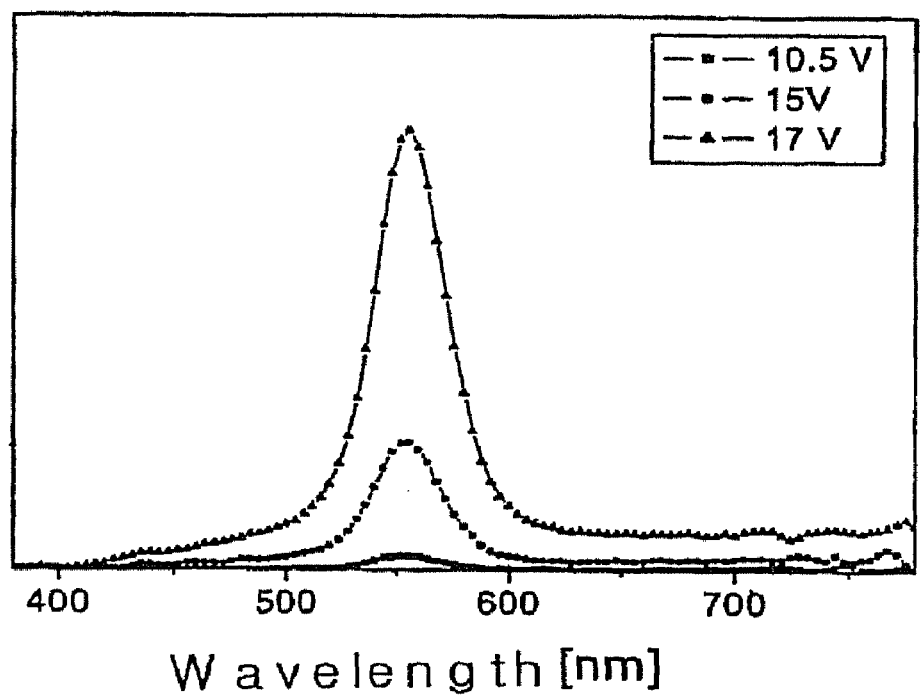
FIGS. 6a and 6b are luminescence spectra of electroluminescence devices fabricated in Examples 1 and 2 of the present invention according to the changes in the voltages applied to the devices, respectively.

FIG. 6a shows luminescence spectra of the electroluminescence device according to the changes in the voltages applied to the device. As shown in FIG. 6a, a luminescence peak having a full-width at half maximum (FWHM) of about 40 nm was observed around 556 nm.

Example 2

Fabrication of Electroluminescence Device Employing CdSeS Nanocrystal Light-Emitting Layer Dispersed in Chlorobenzene First, an ITO-patterned glass substrate was sequentially washed with a neutral detergent, deionized water, water and isopropyl alcohol, and was then subjected to UV-ozone treatment. A solution of 1 wt % of poly(9,9'-dioctylfluorene-co-N-(4-butylphenyl)diphenylamine (TFB) in chlorobenzene was spin-coated on the ITO-patterned substrate to a thickness of about 50 nm, and then baked at 180° C. for 10 minutes to form a hole transport layer. A dispersion of 1 wt % of the CdSeS nanocrystals prepared in Preparative Example 1 in chlorobenzene was spin-coated on the hole transport layer, and dried to form a nanocrystal light-emitting layer having a thickness of about 5 nm. At this time, the chlorobenzene used herein is a solvent which does not dissolve the hole transport layer.

(3-4-Biphenyl)-4-phenyl-5-(4-tert-butylphenyl)-1,2,4-triazole (TAZ) was deposited on the completely dried nanocrystal light-emitting layer to form a hole blocking layer having a thickness of 10 nm, and then tris(8-hydroxyquinoline)-aluminum (Alq3) was deposited thereon to form an electron transport layer having a thickness of about 30 nm. LiF and aluminum were sequentially deposited on the electron transport layer to thicknesses of 1 nm and 200 nm, respectively, to form an electrode, thereby fabricating the final electroluminescence device.

Figure 6B:
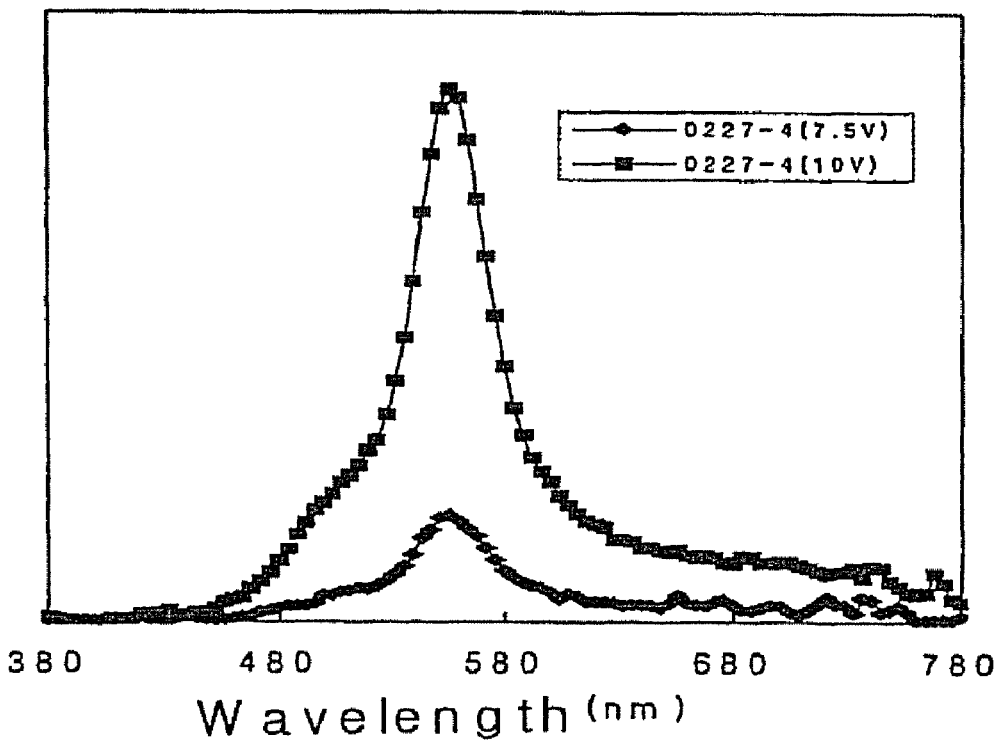

FIG. 6b shows luminescence spectra of the electroluminescence device wherein the nanocrystal light-emitting layer was independently and separately formed, according to the changes in the voltages applied to the device. As shown in FIG. 6b, a luminescence peak having a full-width at half maximum (FWHM) of about 50 nm was observed around 556 nm.

Example 3

Fabrication of Electroluminescence Device Employing CdSe/ZnS Nanocrystal Light-Emitting Layer Dispersed in Octane and Including No Hole Blocking Layer First, an ITO-patterned glass substrate was sequentially washed with a neutral detergent, deionized water, water and isopropyl alcohol, and was then subjected to UV-ozone treatment. A solution of 1 wt % of poly(9,9'-dioctylfluorene-co-N-(4-butylphenyl)diphenylamine (TFB) in chlorobenzene was spin-coated on the ITO-patterned substrate to a thickness of about 50 nm, and then baked at 180° C. for 10 minutes to form a hole transport layer. A dispersion of the CdSe/ZnS nanocrystals (1 wt %) prepared in Preparative Example 2 in octane was spin-coated on the hole transport layer, and dried to form a nanocrystal light-emitting layer having a thickness of about 5 nm. At this time, the octane used herein is a solvent which does not dissolve the hole transport layer.

Tris(8-hydroxyquinoline)-aluminum (Alq3) was deposited on the completely dried nanocrystal light-emitting layer to form an electron transport layer having a thickness of about 40 nm. LiF and aluminum were sequentially deposited on the electron transport layer to thicknesses of 1 nm and 200 nm, respectively, to form an electrode, thereby fabricating the final electroluminescence device.

Figure 7:
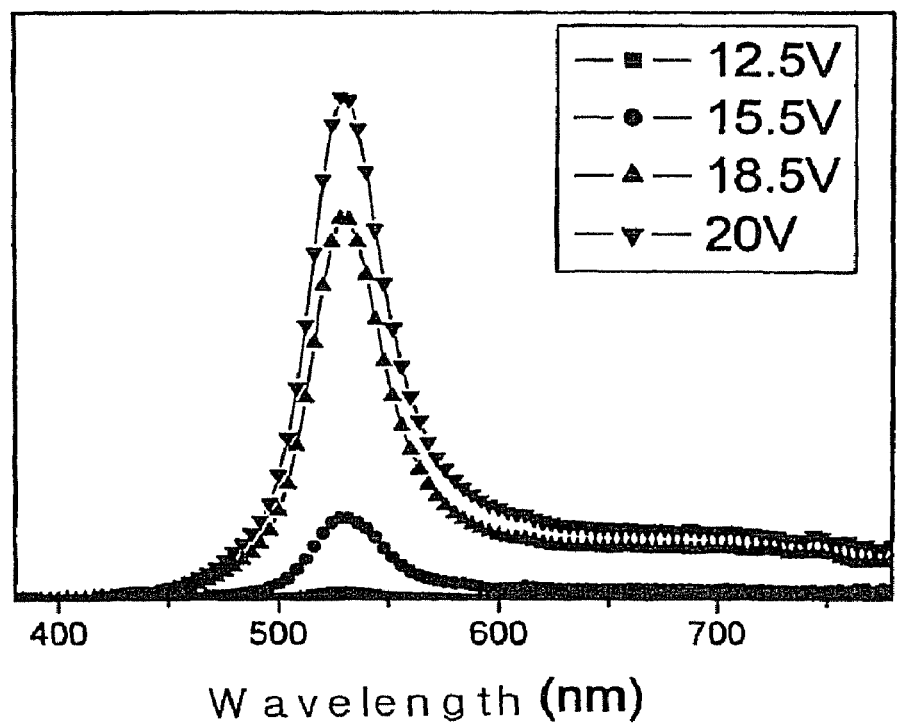
FIG. 7 shows luminescence spectra of an electroluminescence device fabricated in Example 3 of the present invention according to the changes in the voltages applied to the device.

FIG. 7 shows luminescence spectra of the electroluminescence device wherein the nanocrystal light-emitting layer was independently and separately formed, according to the changes in the voltages applied to the device. As shown in FIG. 7, a luminescence peak having a full-width at half maximum (FWHM) of about 46 nm was observed around 530 nm.

Comparative Example 1

Fabrication of Conventional Electroluminescence Device from Mixed Solution of Hole Transporting Material and CdSeS Nanocrystals This comparative example realizes a method for fabricating a conventional electroluminescence device wherein after a mixture of nanocrystals and a hole transporting material is coated, the resulting hole transport layer and nanocrystal layer are separated from each other due to the difference in the density of the nanocrystals, which results from phase separation arising during the coating.

First, an ITO-patterned glass substrate was sequentially washed with a neutral detergent, deionized water, water and isopropyl alcohol, and was then subjected to UV-ozone treatment. A solution of 1 wt % of poly(9,9'-dioctylfluorene-co-N-(4-butylphenyl)diphenylamine (TFB) and the CdSeS nanocrystals prepared in Preparative Example 1 in chlorobenzene was spin-coated on the ITO-patterned substrate, and then baked at 180° C. for 10 minutes to form a hole transport layer in which a nanocrystal light-emitting layer was included. At this time, the weight ratio of the TFB to the CdSeS nanocrystals was adjusted to 1:1.

(3-4-Biphenyl)-4-phenyl-5-(4-tert-butyl phenyl)-1,2,4-triazole (TAZ) was deposited on the completely dried hole transport layer to form a hole blocking layer having a thickness of 10 nm, and then tris(8-hydroxyquinoline)-aluminum (Alq3) was deposited thereon to form an electron transport layer having a thickness of about 30 nm. LiF and aluminum were sequentially deposited on the electron transport layer to thicknesses of 1 nm and 200 nm, respectively, to form an electrode, thereby fabricating the final electroluminescence device.

Figure 8:
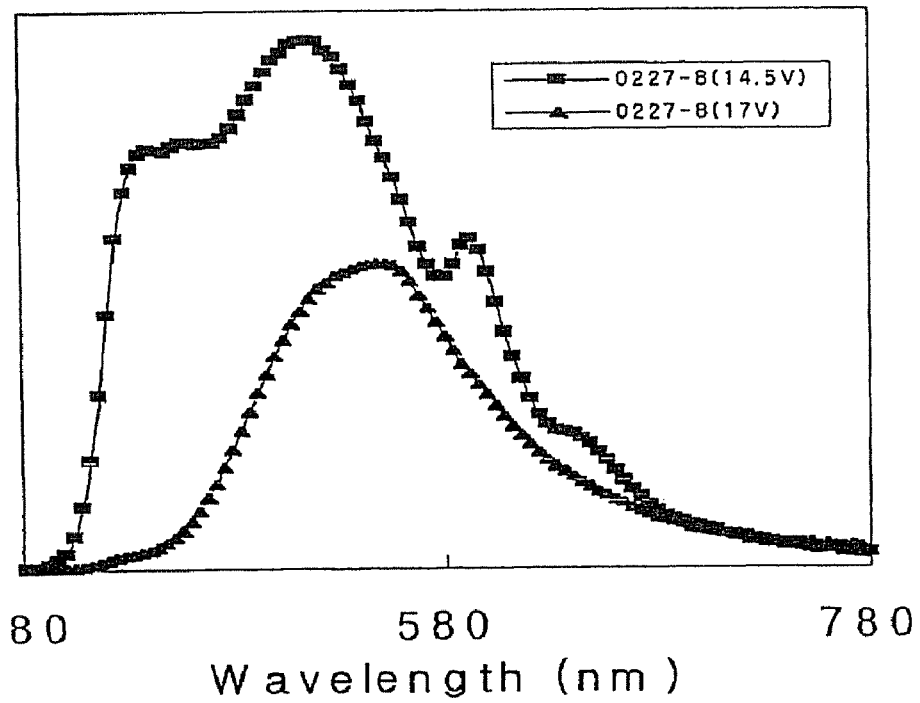
FIG. 8 shows luminescence spectra of a conventional electroluminescence device fabricated in Comparative Example 1 according to the changes in the voltages applied to the device.

FIG. 8 shows luminescence spectra of the electroluminescence device according to the changes in the voltages applied to the device. It was confirmed from FIG. 8 that the hole transport layer including the nanocrystal layer, as well as the electron transport layers emitted light.

As apparent from the foregoing, the electroluminescence device of the present invention has a direct transition-type bandgap ranging from the visible to the infrared range, and includes a nanocrystal light-emitting layer which is made of nanocrystals with enhanced luminescence efficiency and is independently and separately formed. Accordingly, the electroluminescence device of the present invention provides a pure nanocrystal luminescence spectrum having limited luminescence from other organic layers and substantially no influence by operational conditions, such as voltage, resulting in a high color purity. In addition, according to the method of the present invention, materials for a hole transport layer can be selected, regardless of the solubility in a solvent which disperses nanocrystals. Accordingly, the method of the present invention has an advantage in terms of improved workability.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for fabricating an electroluminescence device, comprising the steps of:
    patterning a hole-injecting anode on a substrate and forming a polymer hole transport layer thereon;
    coating a nanocrystal dispersion on the polymer hole transport layer to form a nanocrystal light-emitting layer;
    forming an organic electron transport layer on the nanocrystal light-emitting layer; and
    forming an electron-injecting cathode on the organic electron transport layer,
    wherein the nanocrystal light-emitting layer is formed by dispersing nanocrystals surface-bound by a photosensitive compound in a solvent which does not damage the polymer hole transport layer to obtain a nanocrystal dispersion, and coating the nanocrystal dispersion on the polymer hole transport layer; or dispersing nanocrystals surface-bound by a material containing no photosensitive functional group and a photosensitive compound in a solvent which does not damage the polymer hole transport layer to obtain a nanocrystal dispersion, and coating the nanocrystal dispersion on the polymer hole transport layer.

2. The method according to claim 1, wherein the nanocrystal light-emitting layer is made of at least one material selected from the group consisting of metal nanocrystals, Group II-VI compound semiconductor nanocrystals, Group III-V compound semiconductor nanocrystals, PbS, PbSe and PbTe, the metal nanocrystals including Au, Ag, Pt, Pd, Co, Cu and Mo, the Group II-IV compound semiconductor nanocrystals including CdS, CdSe, CdTe, ZnS, ZnSe, ZnTe, HgS, HgSe and HgTe, the Group III-V compound semiconductor nanocrystals including GaN, GaP, GaAs, InP and InAs; and when the nanocrystal light-emitting layer is made of a mixture of two or more nanocrystals, the nanocrystals exist in the state of a simple mixture, fused crystals in which the nanocrystals are partially present in the same crystal structure, or an alloy.

3. The method according to claim 1, wherein the solvent which does not damage the hole transport layer and disperses the nanocrystals is selected from the group consisting of water, pyridine, ethanol, propanol, butanol, pentanol, hexanol, toluene, chloroform, chlorobenzene, THF, cyclohexane, cyclohexene, methylene chloride, pentane, hexane, heptane, octane, nonane, decane, undecane, dodecane, and mixtures thereof.

4. The method according to claim 1, wherein the electron transport layer is formed by spin coating, dip coating, spray coating, or blade coating.

5. The method according to claim 1, wherein the nanocrystal dispersion has a concentration of 0.01 wt %~10 wt %.

6. The method according to claim 1, wherein the nanocrystal light-emitting layer has a thickness of 3 nm~30 nm.

7. The method according to claim 1, wherein the polymer hole transport layer is made of a material selected from the group consisting of poly(3,4-ethylenedioxythiophene) (PEDOT)/polystyrene para-sulfonate (PSS), poly-N-vinylcarbazole derivatives, polyphenylenevinylene derivatives, polyparaphenylene derivatives, polymethacrylate derivatives, poly(9,9-octylfluorene) derivatives, and poly(spiro-fluorene) derivatives.

8. The method according to claim 1, wherein the electron transport layer is formed on the nanocrystal light-emitting layer by thermal deposition, molecular deposition or chemical deposition.

9. The method according to claim 1, further comprising the step of exposing the nanocrystal light-emitting layer to UV light to crosslink it, prior to coating the organic electron transporting material on the nanocrystal light-emitting layer.

10. The method according to claim 1, wherein the photosensitive compound surface-bound to the nanocrystals contains a double bond, a carboxyl group, an amide group, a phenyl group, a biphenyl group, a peroxide group, an amine group, or an acryl group.

11. The method according to claim 1, further comprising the step of inserting a hole injection layer between the anode and the hole transport layer; inserting an electron blocking layer between the nanocrystal light-emitting layer and the hole transport layer; or inserting a hole blocking layer between the nanocrystal light-emitting layer and the electron transport layer.

* * * * *